(12) United States Patent
Kishimoto

(10) Patent No.: US 10,700,262 B2
(45) Date of Patent: Jun. 30, 2020

(54) PIEZOELECTRIC DEVICE AND PRODUCTION METHOD FOR PIEZOELECTRIC DEVICE

(71) Applicant: Murata Manufacturing Co., Ltd., Nagaokakyo-shi, Kyoto-fu (JP)

(72) Inventor: Yutaka Kishimoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 624 days.

(21) Appl. No.: 15/600,828

(22) Filed: May 22, 2017

(65) Prior Publication Data

US 2017/0256701 A1    Sep. 7, 2017

Related U.S. Application Data

(63) Continuation of application No. PCT/JP2015/082184, filed on Nov. 17, 2015.

(30) Foreign Application Priority Data

Dec. 8, 2014  (JP) .................................. 2014-247755

(51) Int. Cl.
*H01L 41/053*    (2006.01)
*H01L 41/332*    (2013.01)
(Continued)

(52) U.S. Cl.
CPC ............ *H01L 41/332* (2013.01); *H01L 41/04* (2013.01); *H01L 41/0805* (2013.01);
(Continued)

(58) Field of Classification Search
CPC ... H01L 41/332; H01L 41/04; H01L 41/0805; H01L 41/0906; H01L 41/18; H01L 41/27;
(Continued)

(56) References Cited

U.S. PATENT DOCUMENTS 5,801,069 A    9/1998 Harada et al.
2004/0140732 A1*    7/2004 Truninger ............ B41J 2/14201
310/300

(Continued)

FOREIGN PATENT DOCUMENTS

JP    09-83029 A    3/1997
JP    4636292 B2    2/2011
(Continued)

OTHER PUBLICATIONS

Official Communication issued in International Patent Application No. PCT/JP2015/082184 dated Dec. 15, 2015.

*Primary Examiner* — Thomas M Dougherty
(74) *Attorney, Agent, or Firm* — Keating & Bennett, LLP

(57) ABSTRACT

A piezoelectric resonator includes a piezoelectric thin film including a functional conductor, a fixing layer provided on a principal surface of the piezoelectric thin film to define a void that overlaps a functional portion region, and a support substrate on a principal surface of the fixing layer. A sacrificial layer is provided on a principal surface of a piezoelectric substrate and the fixing layer is provided on the principal surface of the piezoelectric substrate to cover the sacrificial layer. The support substrate is attached to a surface of the fixing layer and the piezoelectric thin film is peeled from the piezoelectric substrate. The functional conductor is provided on the piezoelectric thin film, a through hole is provided in the piezoelectric thin film to straddle a boundary between the fixing layer and the sacrificial layer, and the sacrificial layer is removed by wet etching using the through hole to form the void.

9 Claims, 4 Drawing Sheets

(51) Int. Cl.

| | |
|---|---|
| *H01L 41/337* | (2013.01) |
| *H03H 3/08* | (2006.01) |
| *H03H 9/25* | (2006.01) |
| *H01L 41/04* | (2006.01) |
| *H01L 41/08* | (2006.01) |
| *H01L 41/09* | (2006.01) |
| *H01L 41/18* | (2006.01) |
| *H01L 41/27* | (2013.01) |
| *H03H 3/02* | (2006.01) |
| *H03H 9/02* | (2006.01) |

(52) U.S. Cl.
CPC .......... *H01L 41/0906* (2013.01); *H01L 41/18* (2013.01); *H01L 41/27* (2013.01); *H01L 41/337* (2013.01); *H03H 3/02* (2013.01); *H03H 3/08* (2013.01); *H03H 9/02228* (2013.01); *H03H 9/25* (2013.01); *H03H 2003/021* (2013.01)

(58) Field of Classification Search
CPC .......... H01L 41/337; H03H 3/02; H03H 3/08; H03H 9/02228; H03H 9/25; H03H 2003/021
USPC .................................. 310/328, 324
See application file for complete search history.

(56) References Cited

U.S. PATENT DOCUMENTS

| | | | |
|---|---|---|---|
| 2006/0202769 | A1* | 9/2006 | Nagao ............... H03H 3/02 331/73 |
| 2009/0260436 | A1* | 10/2009 | Tochi ............... G01C 19/5642 73/504.12 |
| 2010/0052472 | A1 | 3/2010 | Nishino et al. |
| 2010/0327702 | A1* | 12/2010 | Martin ............... B81B 3/0072 310/346 |
| 2012/0205754 | A1 | 8/2012 | Iwamoto |
| 2013/0234805 | A1 | 9/2013 | Takahashi |
| 2014/0009032 | A1 | 1/2014 | Takahashi et al. |
| 2014/0152145 | A1 | 6/2014 | Kando et al. |
| 2014/0374858 | A1* | 12/2014 | Naegele-Preissmann ................... G01L 1/148 257/419 |
| 2016/0233413 | A1* | 8/2016 | Zawada ............... H01L 41/053 |

FOREIGN PATENT DOCUMENTS

| | | |
|---|---|---|
| JP | 2011-077810 A | 4/2011 |
| JP | 2013-214954 A | 10/2013 |
| JP | 2014-013991 A | 1/2014 |
| WO | 2011/052551 A1 | 5/2011 |
| WO | 2012/073871 A1 | 6/2012 |

* cited by examiner

PIEZOELECTRIC DEVICE AND PRODUCTION METHOD FOR PIEZOELECTRIC DEVICE

CROSS REFERENCE TO RELATED APPLICATIONS

This application claims the benefit of priority to Japanese Patent Application No. 2014-247755 filed on Dec. 8, 2014 and is a Continuation Application of PCT Application No. PCT/JP2015/082184 filed on Nov. 17, 2015. The entire contents of each application are hereby incorporated herein by reference.

BACKGROUND OF THE INVENTION

1. Field of the Invention

The present invention relates to a piezoelectric device including a thin film of a piezoelectric single crystal, and a production method for the piezoelectric device.

2. Description of the Related Art

In recent years, many piezoelectric devices in which a thin film of a piezoelectric single crystal is used have been developed. There is such a piezoelectric device which includes a piezoelectric thin film that functions as a piezoelectric device and having an electrode formed thereon; and a support that supports the piezoelectric thin film and in which a membrane structure forming a space between the support and a region where the electrode is formed is used (see, for example, Japanese Patent No. 4636292).

Japanese Patent No. 4636292 discloses a production method for a piezoelectric resonator having a membrane structure. In the production method disclosed in Japanese Patent No. 4636292, first, a sacrificial layer is formed on a front surface of a piezoelectric substance, and a support member is bonded to the front surface of the piezoelectric substance so as to cover the sacrificial layer. A piezoelectric film is peeled from the piezoelectric substance, and a so-called interdigital transducer (IDT) electrode and the like are formed on the piezoelectric film. Then, a through hole is formed in the piezoelectric film, and etching is performed through the through hole to remove the sacrificial layer. Accordingly, a piezoelectric resonator is produced in which the piezoelectric film is in a state of floating on a void.

In Japanese Patent No. 4636292, since the sacrificial layer is removed through the through hole formed in the piezoelectric film when forming the void, the through hole has to penetrate the piezoelectric film to reach the sacrificial layer. However, in the production method disclosed in Japanese Patent No. 4636292, it is difficult to determine whether the through hole formed in the piezoelectric film reaches the sacrificial layer. Thus, if the through hole does not reach the sacrificial layer, it may not be possible to remove the sacrificial layer by etching to form the void.

SUMMARY OF THE INVENTION

Preferred embodiments of the present invention provide piezoelectric devices including a piezoelectric film in which a through hole defining a void is reliably and accurately provided, and production methods for the piezoelectric devices.

A piezoelectric device according to a preferred embodiment of the present invention preferably includes a piezoelectric film including a through hole extending in a thickness direction; a functional conductor provided on the piezoelectric film; a fixing layer provided on a principal surface of the piezoelectric film such that a void is defined at a position overlapping a region where the functional conductor is located in plan view; and a support substrate provided on a principal surface of the fixing layer opposite to the piezoelectric film, wherein the through hole straddles a boundary between the fixing layer and the void in plan view, and the fixing layer includes a step at a position overlapping the through hole in plan view.

With this configuration, the step provided in the fixing layer is formed during a production process of the piezoelectric device. Since the through hole is used in forming the void, the through hole is reliably and accurately formed in the region where the void is located. Thus, by confirming whether the step is present, it is possible to determine where the void is reliably and accurately provided.

Another preferred embodiment of the present invention provides a production method for a piezoelectric device including a piezoelectric film including a functional conductor provided thereon, a fixing layer provided on a principal surface of the piezoelectric film such that a void is defined at a position overlapping a region where the functional conductor is provided in plan view, and a support substrate provided on a principal surface of the fixing layer opposite to the piezoelectric film, the production method including forming a sacrificial layer on a principal surface of a piezoelectric substrate; forming the fixing layer on the principal surface of the piezoelectric substrate to cover the sacrificial layer; attaching the support substrate to a surface of the fixing layer opposite to the piezoelectric substrate; forming the piezoelectric film from the piezoelectric substrate; forming the functional conductor on the piezoelectric film; forming a through hole in the piezoelectric film to straddle a boundary between the fixing layer and the sacrificial layer in plan view; and removing the sacrificial layer by wet etching using the through hole, to form the void.

In this production method according to a preferred embodiment of the present invention, the through hole used in forming the void is formed at a position straddling the boundary between the fixing layer and the sacrificial layer. Due to the difference in material between the fixing layer and the sacrificial layer, an etching rate is different between the fixing layer and the sacrificial layer so that a step is formed at a bottom of the through hole. By confirming whether the step is present, it is possible to determine whether the through hole reaches the sacrificial layer. When the through hole is formed to reliably and accurately reach the sacrificial layer, it is possible to remove the sacrificial layer by wet etching to reliably and accurately form the void. Thus, it is possible to efficiently produce the piezoelectric device.

According to various preferred embodiments of the present invention, it is possible to reliably and accurately form the through hole, which is used in forming the void, in the piezoelectric thin film, and to accurately and reliably form the void.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
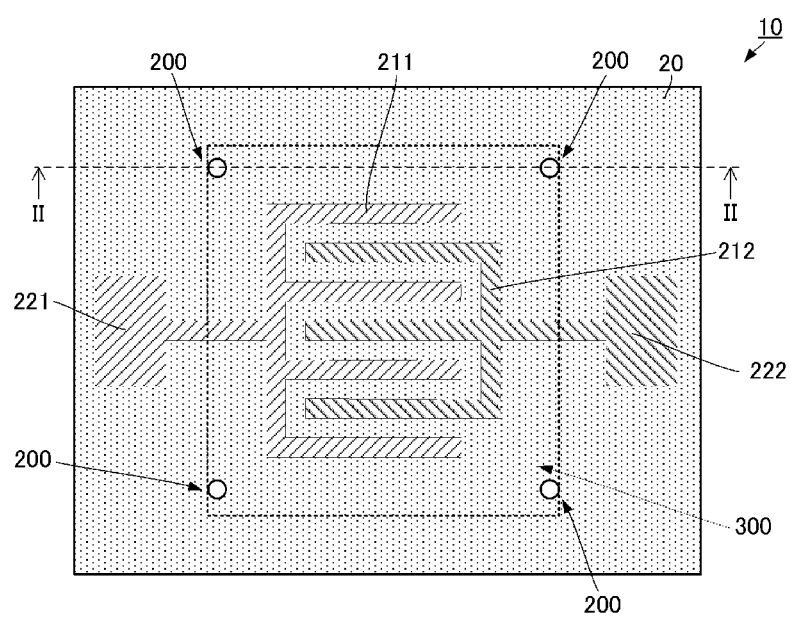
FIG. 1 is a plan view of a piezoelectric resonator according to a preferred embodiment of the present invention.
Figure 2:
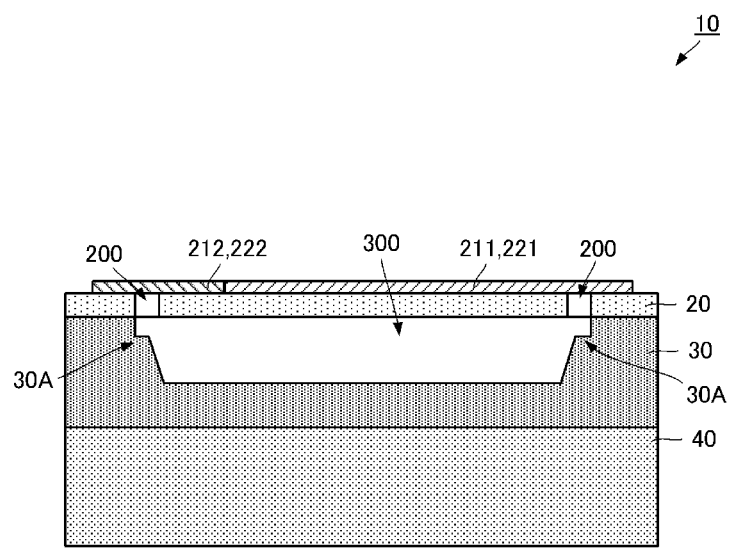
FIG. 2 is a cross-sectional view of the piezoelectric resonator, taken along the line II-II in FIG. 1.

FIG. 1 is a plan view of a piezoelectric resonator according to a preferred embodiment of the present invention. FIG. 2 is a cross-sectional view of the piezoelectric resonator, taken along the line II-II in FIG. 1. The piezoelectric resonator is an example of a piezoelectric device according to preferred embodiments of the present invention.

The piezoelectric resonator 10 preferably includes a piezoelectric thin film 20, a fixing layer 30, and a support substrate 40. The piezoelectric thin film 20 is preferably, for example, a permeable piezoelectric substance such as LN (LiNbO$_3$) or LT (LiTaO$_3$). The fixing layer 30 is preferably, for example, an insulator such as SiO$_2$. The support substrate 40 is preferably, for example, Si, sapphire, glass, or the like.

Functional conductors 211 and 212 are provided on a front surface of the piezoelectric thin film 20. The functional conductors 211 and 212 each preferably have a comb shape in plan view. The functional conductors 211 and 212 are disposed to define an interdigital transducer. Hereinafter, a region where the functional conductors 211 and 212 are provided is referred to as a functional portion region.

In addition, wiring conductors 221 and 222 are provided on the front surface of the piezoelectric thin film 20. The wiring conductor 221 is connected to the functional conductor 211. The wiring conductor 222 is connected to the functional conductor 212. The wiring conductors 221 and 222 are conductors that connect the functional conductors 211 and 212 to external circuits, respectively.

The functional conductors 211 and 212 and the wiring conductors 221 and 222 are made of materials having high electrical conductivity such as Al, Cu, Au, etc.

The fixing layer 30 and the support substrate 40 are bonded to a back surface of the piezoelectric thin film 20 in this order. That is, the piezoelectric thin film 20 is fixed to the support substrate 40 by the fixing layer 30. In other words, the support substrate 40 is fixed to a first principal surface of the fixing layer 30 and the piezoelectric thin film 20 is fixed to a second principal surface of the fixing layer 30.

The fixing layer 30 is provided on the piezoelectric thin film 20 to surround the functional portion region in plan view. Accordingly, a void 300 surrounded by the back surface of the piezoelectric thin film 20 and an inner wall surface of the fixing layer 30 is defined at a position facing the functional portion region.

Through holes 200 are provided in the piezoelectric thin film 20 to communicate with the void 300. The through holes 200 are located at the inner side of the void 300 in plan view, and are preferably provided at an outermost boundary of the periphery of the void. More specifically, the through holes 200 are defined at positions straddling the boundary between an inner wall of the fixing layer 30 and the void 300 in plan view. The straddling positions are positions at which the through holes 200 and the boundary between the inner wall of the fixing layer 30 and the void 300 overlap each other in plan view. When forming the through holes 200, steps 30A are simultaneously provided on the inner wall of the fixing layer 30 that overlaps the through holes 200. It is noted that the steps 30A may preferably be provided in the through holes 200 in an off-center manner.

As shown in FIG. 2, the steps 30a are provided at positions between the second principal surface of the fixing layer and a bottom of the fixing layer 30, in a direction of a thickness of the fixing layer 30, and an angle of inclination of the steps 30a is different from an angle of inclination of the inner wall of the fixing layer 30 except for the step, in a cross-sectional view.

Although described later, the void 300 is preferably defined by forming a sacrificial layer of ZnO or the like and removing the sacrificial layer by wet etching, for example. The through holes 200 provide communication between the sacrificial layer 31 and the outside, and are used in removing the sacrificial layer by wet etching, for example. Thus, the through holes 200 have to be formed to reliably and accurately reach the sacrificial layer. In the present preferred embodiment, it is possible to determine that the through holes 200 are reliably and accurately formed when formation of the steps 30A is confirmed during production.

Hereinafter, a production process for the piezoelectric resonator 10 will be described.

Figure 3:
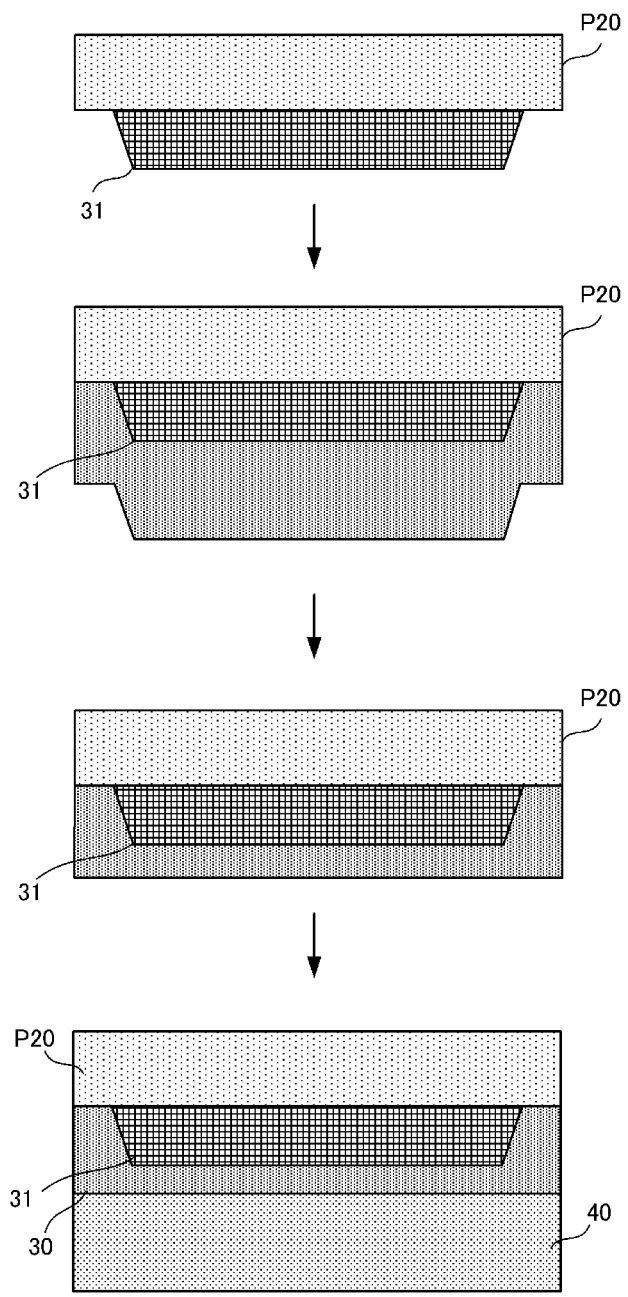
FIG. 3 is cross-sectional views showing shapes in respective steps in a production method for a piezoelectric resonator according to a preferred embodiment of the present invention.
Figure 4:
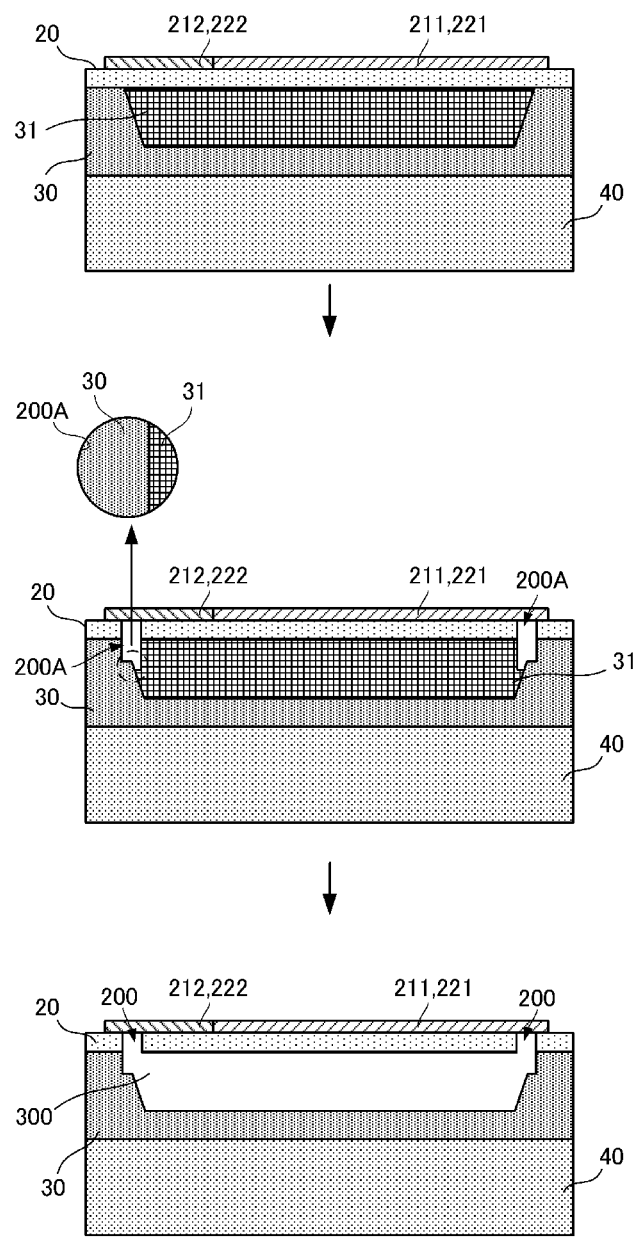
FIG. 4 is cross-sectional views showing shapes in respective steps in a production method for a piezoelectric resonator according to a preferred embodiment of the present invention.

FIGS. 3 and 4 are cross-sectional views showing shapes in respective steps in the production method for the piezoelectric resonator 10 according to the present preferred embodiment. Each of the cross-sections shown in FIGS. 3 and 4 corresponds to a cross-section taken along the line II-II in FIG. 1. The intermediate diagram in FIG. 4 shows an enlarged plan view of the inside of a broken line.

First, the sacrificial layer 31 is formed on a back surface of a piezoelectric substrate P20. The sacrificial layer 31 is, for example, ZnO. Subsequently, the fixing layer 30 is formed on the back surface of the piezoelectric substrate P20 to cover the sacrificial layer 31. Since the fixing layer 30 is formed to cover the sacrificial layer 31 and the like, unevenness may occur in a surface opposite to the piezoelectric substrate P20. Thus, the uneven surface of the fixing layer 30 is polished to be flattened by CMP (Chemical Mechanical Polishing).

Next, the support substrate 40 is preferably bonded to the flattened principal surface of the fixing layer 30 by, for example, a resin adhesive. For bonding the substrate, another joining method such as metal joining or interatomic force joining, for example, may be used. Then, the piezoelectric substrate P20 is made into a thin film by polishing to form the piezoelectric thin film 20. The functional conductors 211 and 212 are formed on the front surface of the formed piezoelectric thin film 20. The functional conductors 211 and 212 are preferably formed as laminate electrodes of Al/Ti by a vapor deposition/lift-off method. At this time, although not shown, the wiring conductors 221 and 222 are also formed on the front surface of the piezoelectric thin film 20 by the vapor deposition/lift-off method.

Next, dry etching is performed at positions on the piezoelectric thin film 20 straddling the boundary between the sacrificial layer 31 and the fixing layer 30 in plan view. Holes 200A are formed by the dry etching to reach a predetermined depth from the piezoelectric thin film 20. When the dry etching is performed, the piezoelectric thin film 20 is initially etched, and then the fixing layer 30 and the sacrificial layer 31 are etched. Since the materials of the fixing layer 30 and the sacrificial layer 31 are different from each other, the depths of the holes 200A formed in the fixing layer 30 are different from the depths of the holes 200A formed in the sacrificial layer 31 due to the difference in etching rate. Thus, a step is formed at the bottom of each hole 200A. Each step 30A described with reference to FIG. 2 is formed when this dry etching is performed.

Before the wet etching is performed, whether a step has been formed in each of the formed holes 200A is determined, such that it is possible to determine whether each hole 200A reliably and accurately reaches the sacrificial layer 31. The determination as to whether a step is present is performed, for example, by measuring a step within the hole 200A by using a scanning probe microscope.

After confirming that a step is present in each hole 200A and each hole 200A reaches the sacrificial layer 31, the sacrificial layer 31 is removed, preferably by wet etching through the holes 200A. Because of this processing, the void 300 is formed in the fixing layer 30, and the through holes 200 in communication with the void 300 are left in the piezoelectric thin film 20.

By carrying out the above production method, the piezoelectric resonator 10 is formed. When each hole 200A is provided to form the void 300, if a step is not present in each hole 200A, each hole 200A may not have reached the sacrificial layer 31 and may only be provided in the piezoelectric thin film 20. In this case, there is a problem that it is not possible to remove the sacrificial layer 31 by wet etching so that it is not possible to form the void 300. Thus, by forming each hole 200A over the sacrificial layer 31 and the fixing layer 30 and measuring whether a step has been formed in each hole 200A as in the present preferred embodiment, it is confirmed whether each hole 200A reliably and accurately reaches the sacrificial layer 31, such that it is possible to reliably and accurately form the void 300.

In addition, in the present preferred embodiment, the piezoelectric resonator has been described as a non-limiting example, but the present invention is also applicable to various piezoelectric devices and a filter including a piezoelectric resonator.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
   a piezoelectric film including a through hole provided in a thickness direction;
   a functional conductor provided on the piezoelectric film;
   a fixing layer provided on a principal surface of the piezoelectric film such that a void overlaps a region where the functional conductor is provided in plan view; and
   a support substrate provided on a first principal surface of the fixing layer, the first principal surface being opposite to a second principal surface of the fixing layer which is a principal surface of the piezoelectric film side; wherein
   the fixing layer includes a step provided in an inner wall surface of the fixing layer at a position overlapping the through hole in plan view.

2. The piezoelectric device according to claim 1, wherein
   the step is provided at a position between the second principal surface and a bottom of the fixing layer, in a direction of a thickness of the fixing layer; and
   an angle of inclination of the step is different from an angle of inclination of the inner wall surface except for the step, in a cross-sectional view.

3. The piezoelectric device according to claim 1, wherein the functional conductor includes functional conductors disposed to define an interdigital transducer.

4. The piezoelectric device according to claim 3, wherein the multiple functional conductors are electrically connected to wiring conductors provided on a front surface of the piezoelectric film.

5. The piezoelectric device according to claim 4, wherein the wiring conductors are provided on the front surface of the piezoelectric film to not overlap the void.

6. The piezoelectric device according to claim 4, wherein the multiple functional conductors and the wiring conductors are made of Al, Cu, or Au.

7. The piezoelectric device according to claim 1, wherein a plurality of the through holes are provided.

8. The piezoelectric device according to claim 7, wherein the plurality of the through holes are provided at an outermost boundary of a periphery of the void.

9. The piezoelectric device according to claim 1, wherein the step is located at an off-center position in the through hole.

* * * * *